(12) United States Patent
Ohta et al.

(10) Patent No.: US 6,998,943 B2
(45) Date of Patent: Feb. 14, 2006

(54) HIGH-FREQUENCY POWER AMPLIFIER

(75) Inventors: Akira Ohta, Tokyo (JP); Akira Inoue, Tokyo (JP); Kazuhiro Ueda, Hiroshima (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 69 days.

(21) Appl. No.: 10/756,624

(22) Filed: Jan. 14, 2004

(65) Prior Publication Data
US 2004/0173879 A1 Sep. 9, 2004

(30) Foreign Application Priority Data
Mar. 3, 2003 (JP) .............................. 2003-056298

(51) Int. Cl.
*H01P 3/08* (2006.01)
*H01P 5/00* (2006.01)
(52) U.S. Cl. ..................................... 333/246; 333/260
(58) Field of Classification Search ................ 333/238, 333/243, 246, 247, 260
See application file for complete search history.

(56) References Cited

U.S. PATENT DOCUMENTS 5,469,130 A * 11/1995 Okada et al. ................ 333/246
5,808,529 A * 9/1998 Hamre ........................ 333/246
6,201,439 B1 * 3/2001 Ishida et al. ............. 330/124 R
6,677,839 B1 * 1/2004 Aruga ......................... 333/246
6,753,604 B1 * 6/2004 Hase et al. .................. 257/728

FOREIGN PATENT DOCUMENTS

JP 62-140503 6/1987

OTHER PUBLICATIONS

A. Inoue et al., "High-Efficiency 0.1 cc Power Amplifier Module for 900 MHz Personal Digital Cellular Telephones," *IEICE Trans. Electron.*, vol. E82-C(11), pp. 1906-1912, Nov. 1999.

* cited by examiner

*Primary Examiner*—Dean Takaoka
(74) *Attorney, Agent, or Firm*—Leydig, Voit & Mayer, Ltd.

(57) ABSTRACT

A second strip conductor is located, in a lamination direction of a multilayer substrate, at a is different position from that of a first strip conductor. A first grounding conductor and a second grounding conductor are disposed sequentially in the lamination direction of the multilayer substrate and sandwich the first strip conductor and the second strip conductor. The first grounding conductor includes a first grounding conductor portion for a wiring prohibited area in which no wiring may be placed, and a second grounding conductor portion for an area other than the wiring prohibited area. The second grounding conductor portion is positioned, in the lamination direction of the multilayer substrate, at a location is different from that of the first grounding conductor portion.

6 Claims, 8 Drawing Sheets

Prior Art

Fig. 7A

*Prior Art*

Fig. 7B

*Prior Art*

Fig. 7C

*Prior Art*

HIGH-FREQUENCY POWER AMPLIFIER

BACKGROUND OF THE INVENTION

1. Field of the Invention

The present invention relates to a high-frequency power amplifier, and more particularly to a high-frequency power amplifier for use in cellular telephones, etc.

2. Background Art

Conventionally, high-frequency power amplifiers such as RF power amplifiers have been used in the antenna output stage or the audio output stage of communications equipment.

Figure 6:
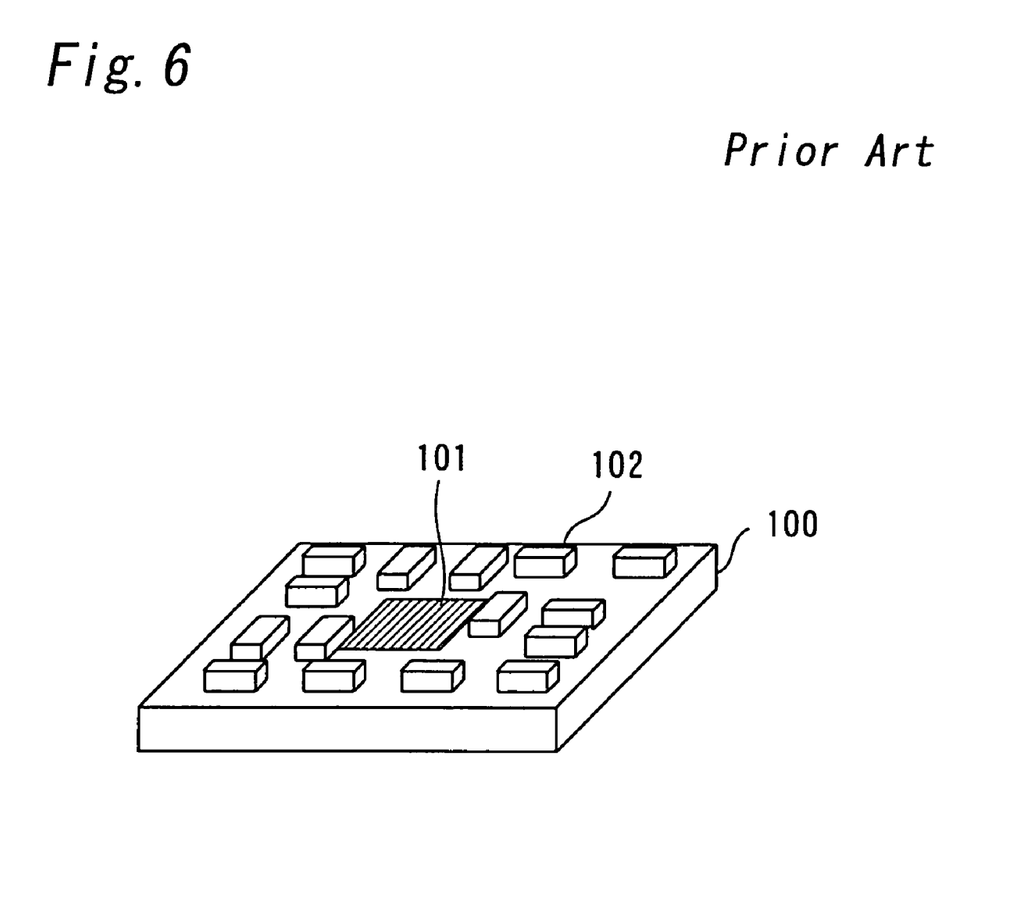
FIG. 6 is a perspective view of a module with a conventional a high-frequency power amplifier.

High-frequency power amplifiers producing an output of 1 W (30 dBm) or so generally require an output matching circuit to supply the power to a 50 Ω load. FIG. 6 shows the structure of a module example formed by integrating such an output matching circuit with a high-efficiency high-frequency power amplifier (for example, see a paper entitled "High-Frequency 0.1 cc Power Amplifier Module for 900 MHz Personal Digital Cellular Telephones" by Akira Inoue et al., IEIC Trans. Electron, Vol. E82-C, No. 11, pp. 1906–1912, November 1999). In the example of FIG. 6, the matching circuit includes capacitors, inductors, signal lines, etc. To miniaturize the high-efficiency high-frequency power amplifier, chip components having the 1005 size (1.0 mm×0.5 mm) or the 0603 size (0.6 mm×0.3 mm) are used as the capacitors and inductors, which are mounted on a substrate formed of resin, glass ceramics, etc. In the figure, reference numeral 100 denotes a module substrate, 101 denotes a transistor, and 102 denotes chip components.

Figure 7A:
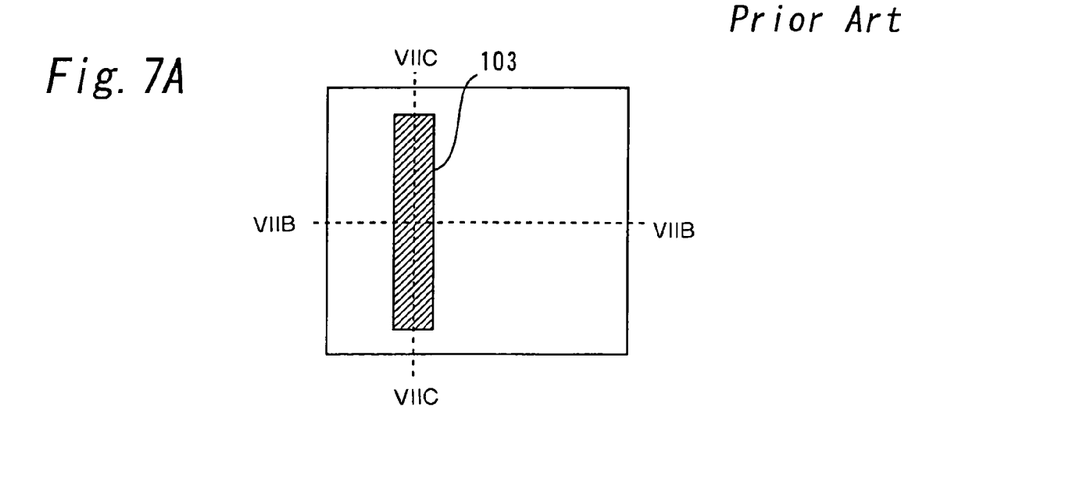
FIG. 7A is a cross-sectional view of a conventional strip line portion.

The above chip components in the high-frequency power amplifier are connected to one another by use of microstrip lines formed on the substrate or strip lines formed within the substrate. FIGS. 7A to 7C show a strip line used in the high-frequency power amplifier shown in FIG. 6. Specifically, FIG. 7A is a plan view of the strip line portion, wherein reference numeral 103 denotes the strip line.

Figure 7B:
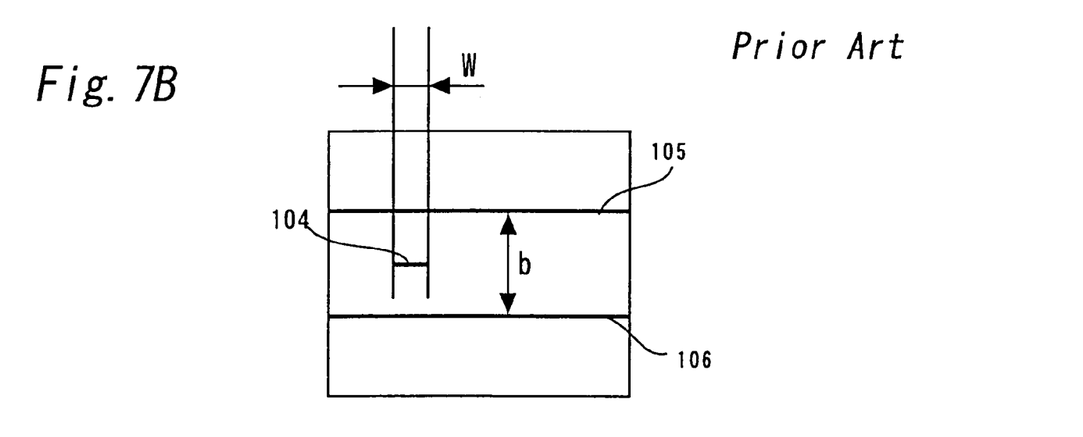
FIG. 7B is a cross-sectional view of the strip line portion shown in FIG. 7A taken along line VIIB—VIIB.

FIG. 7B is a cross-sectional view of the strip line portion shown in FIG. 7A taken along line VIIB—VIIB. As shown in FIG. 7B, the strip line has a 3-metal-layer structure (or a structure including 3 metal layers) in which grounding conductors (hereinafter referred to as GNDs) 105 and 106 sandwich a strip conductor 104 within dielectric material.

The characteristic impedance of the strip line is expressed by Formula 1.

$$(1/4) \times (\mu/\in)^{1/2} \times (b/W), \quad \text{[Formula 1]}$$

where $\mu$ denotes the magnetic permeability and $\in$ denotes the dielectric permittivity. Further, the symbol b denotes the distance between the GND 105 and the GND 106, and W denotes the width of the strip conductor 104, that is, the signal line width, as shown in FIG. 7B. It is assumed that the distance of the GND 105 from the strip conductor 104 is equal to that of the GND 106 from the strip conductor 104.

Assume that there is a strip line having a characteristic impedance optimized through design of the output matching circuit, and a need has arisen to reduce the distance b between the GNDs without changing the characteristic impedance. In such a case, it is necessary to also reduce the signal line width W as indicated by Formula 1. Reducing the signal line width W, however, increases the DC resistance value of the line, resulting in increased loss produced in the strip line. Therefore, it is desirable to increase the distance b in terms of decreasing the loss in the strip line. It should be noted that an increase in the distance b means an increase in the thickness of the substrate constituting the high-frequency power amplifier.

Figure 7C:
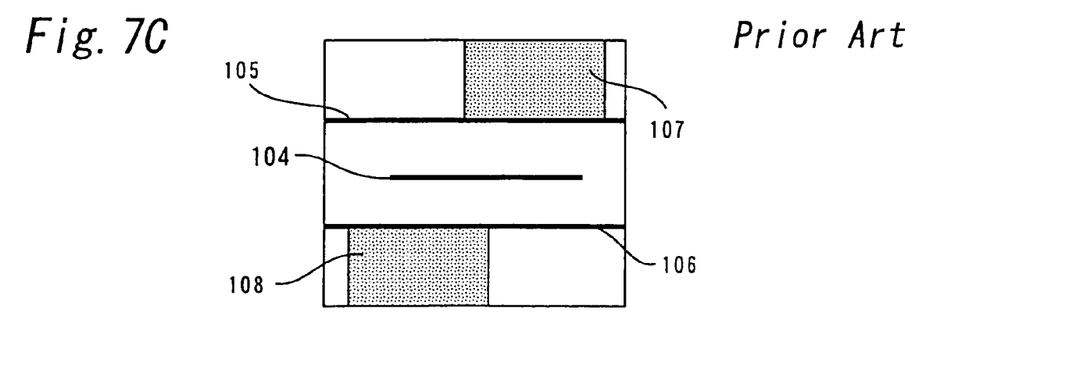
FIG. 7C is a cross-sectional view of the strip line portion shown in FIG. 7A taken along line VIIC—VIIC.

On the other hand, the obverse and the reverse surfaces of the substrate of the high-frequency power amplifier may have wiring prohibited areas therein in which wiring for a strip line is prohibited. For example, in a chip component mounting portion of the substrate, the portion of the substrate top surface on which the non-GND terminals of the chip components exist cannot be used as a GND surface. Therefore, the region of the substrate from the chip component mounting portion to the GND surface within the substrate is set as a wiring prohibited area. FIG. 7C is a cross-sectional view of the strip line portion shown in FIG. 7A taken along line VIIC—VIIC. In the figure, reference numerals 107 and 108 denote wiring prohibited areas.

Figure 8:
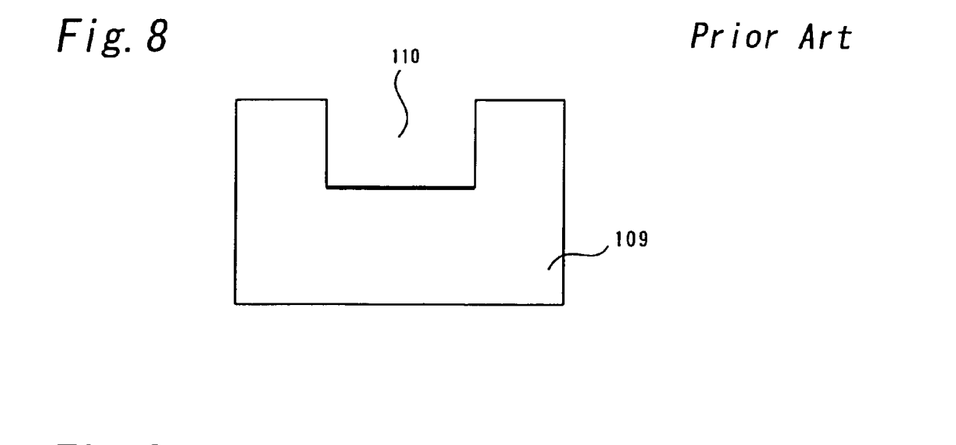
FIG. 8 is a cross-sectional view of a conventional wiring prohibited area.

Further, a cavity structure as shown in FIG. 8 also requires a wiring prohibited area. Specifically, since transistors, etc. are mounted on a cavity portion 110 in a substrate 109, the cavity portion 110 is a wiring prohibited area.

Figure 9:
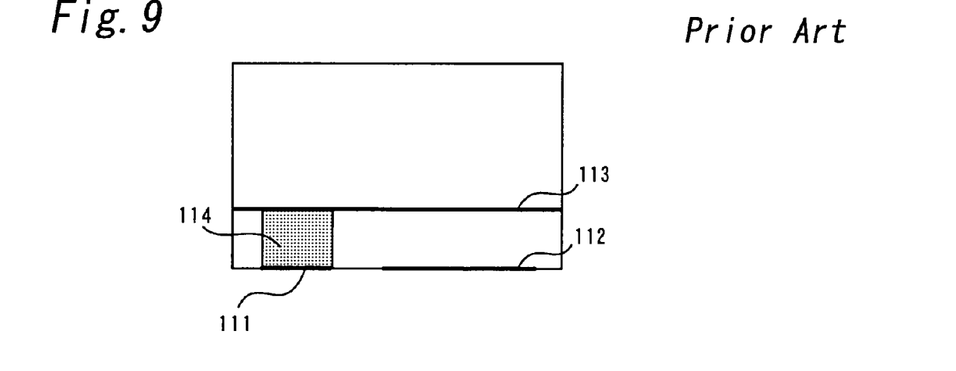
FIG. 9 is a cross-sectional view of a conventional wiring prohibited area.

Still further, as shown in FIG. 9, no GND can be formed on the portion of the reverse surface of the module on which a signal terminal portion 111 is disposed. On the other hand, a GND 112 can be formed on the portion of the rear surface on which the signal terminal portion 111 is not disposed. Therefore, the region of the substrate from the signal terminal portion 111 to a GND surface 113 is set as a wiring prohibited area.

Figure 10:
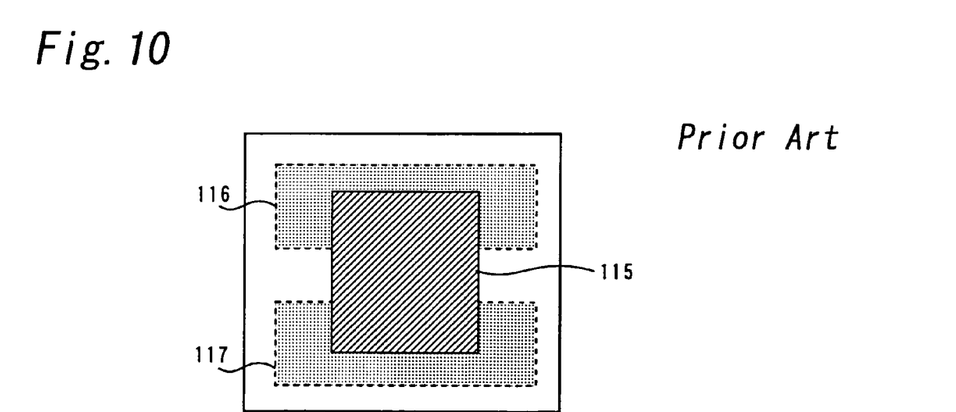
FIG. 10 is a plan view of a conventional wiring prohibited area.

Incidentally, the substrate has a laminated structure in which a plurality of dielectric layers are laminated. It often happens that wiring prohibited areas exist at the same position in the lamination direction of the substrate. FIG. 10 is a plan view of a wiring prohibited area portion. In the figure, the lamination direction of the substrate is perpendicular to the paper. A wiring prohibited area 115 established on the obverse side of the substrate overlaps wiring prohibited areas 116 and 117 established on the reverse side of the substrate. That is, the overlapped portions of these wiring prohibited areas exist at the same position in the lamination direction.

Of all available high-frequency power amplifiers, those exhibiting high efficiency are suitable for the transmitting units of communications equipment terminals such as digital cellular telephones. In recent years, efforts have been made to increasingly reduce the thickness of digital cellular telephones. As a result, there has been an increasing need for thinner and thinner high-frequency power amplifiers.

One way to make a high-frequency power amplifier thinner is to make its substrate thinner, which requires reducing the distances between the strip conductor and the GNDs of the strip line and the distance between the GNDs themselves (that is, the distance b in FIG. 7B). This, however, leads to the problem of increased loss generated in the strip line, as described above.

On the other hand, to increase the efficiency of the high-frequency power amplifier, the loss of the output matching circuit must be reduced. To do so, however, it is necessary to increase the distances between the strip conductor and the GNDs of the strip line and the distance between the GNDs themselves (that is, the distance b in FIG. 7B), which runs counter to reduction of the thickness of the substrate.

The present invention has been devised in view of the above problems. It is, therefore, an object of the present invention to provide a high-frequency power amplifier which is thin but can achieve high efficiency.

Other objects and advantages of the present invention will become apparent from the following description.

SUMMARY OF THE INVENTION

According to one aspect of the present invention, a high-frequency power amplifier comprises a multilayer substrate formed by laminating a plurality of dielectric layers, a wiring prohibited area provided on at least one of a obverse side and a reverse side of the multilayer substrate, a first strip conductor provided within the multilayer substrate, a second strip conductor provided such that its position in a lamination direction of the multilayer substrate is different from that of the first strip conductor, a via for electrically connecting the first strip conductor and the second strip conductor, and a first grounding conductor and a second grounding conductor disposed sequentially in the lamination direction of the multilayer substrate and sandwiching the first strip conductor and the second strip conductor. At least one of the first grounding conductor and the second grounding conductor includes a first grounding conductor portion provided for the wiring prohibited area, and a second grounding conductor portion provided for an area other than the wiring prohibited area such that a position of the second grounding conductor portion in the lamination direction of the multilayer substrate is different from that of the first grounding conductor portion.

According to another aspect of the present invention, a high-frequency power amplifier comprises a multilayer substrate formed by laminating a plurality of dielectric layers, a first wiring prohibited area provided on a obverse side of the multilayer substrate, a second wiring prohibited area provided on a reverse side of the multilayer substrate such that the second wiring prohibited area is disposed at a position at which it overlaps the first wiring prohibited area as viewed in a lamination direction of the multilayer substrate, a strip conductor disposed within the multilayer substrate, and a first grounding conductor and a second grounding conductor disposed sequentially in the lamination direction of the multilayer substrate and sandwiching the strip conductor. A length of the first wiring prohibited area in the lamination direction of the multilayer substrate is equal to that of the second wiring prohibited area. The first grounding conductor includes a first grounding conductor portion provided for the first wiring prohibited area, and a second grounding conductor portion provided for an area on the obverse side of the multilayer substrate such that a position of the second grounding conductor portion in the lamination direction of the multilayer substrate is different from that of the first grounding conductor portion, the area being other than the first wiring prohibited area. The second grounding conductor includes a third grounding conductor portion provided for the second wiring prohibited area, and a fourth grounding conductor portion provided for an area on the reverse side of the multilayer substrate such that a position of the fourth grounding conductor portion in the lamination direction of the multilayer substrate is different from that of the third grounding conductor portion, the area being other than the second wiring prohibited area.

Other and further objects, features and advantages of the invention will appear more fully from the following description.

DETAILED DESCRIPTION OF THE PREFERRED EMBODIMENTS

First Embodiment

A high-frequency power amplifier of a first embodiment of the present invention will be described with reference to FIGS. 1 and 2. In these figures, like numerals denote like components.

According to the present embodiment, a wiring prohibited area is provided on either the obverse side or the reverse side of a multilayer substrate.

A strip line is disposed within the multilayer substrate formed as a result of laminating a plurality of dielectric layers. FIG. 1 is a cross-sectional view of the strip line portion of this multilayer substrate.

In the following example, a wiring prohibited area 1 is provided on the upper side (of the substrate) in FIG. 1. The present embodiment is characterized in that a first grounding conductor (hereinafter referred to as a first GND) 2 is made up of a first grounding conductor portion (hereinafter referred to as a first GND portion) 3 formed for the wiring prohibited area 1 and a second grounding conductor portion (hereinafter referred to as a second GND portion) 4 formed for an area other than the wiring prohibited area 1. The first GND portion 3 and the second GND portion 4 are located at different positions in the $Y_1$ direction shown in FIG. 1. It should be noted that the $Y_1$ direction coincides with the lamination direction of the dielectric layers (not shown) of a multilayer substrate 5. Further, the upper side of the multilayer substrate may be defined as the obverse side on which the semiconductor devices are mounted.

Figure 1:
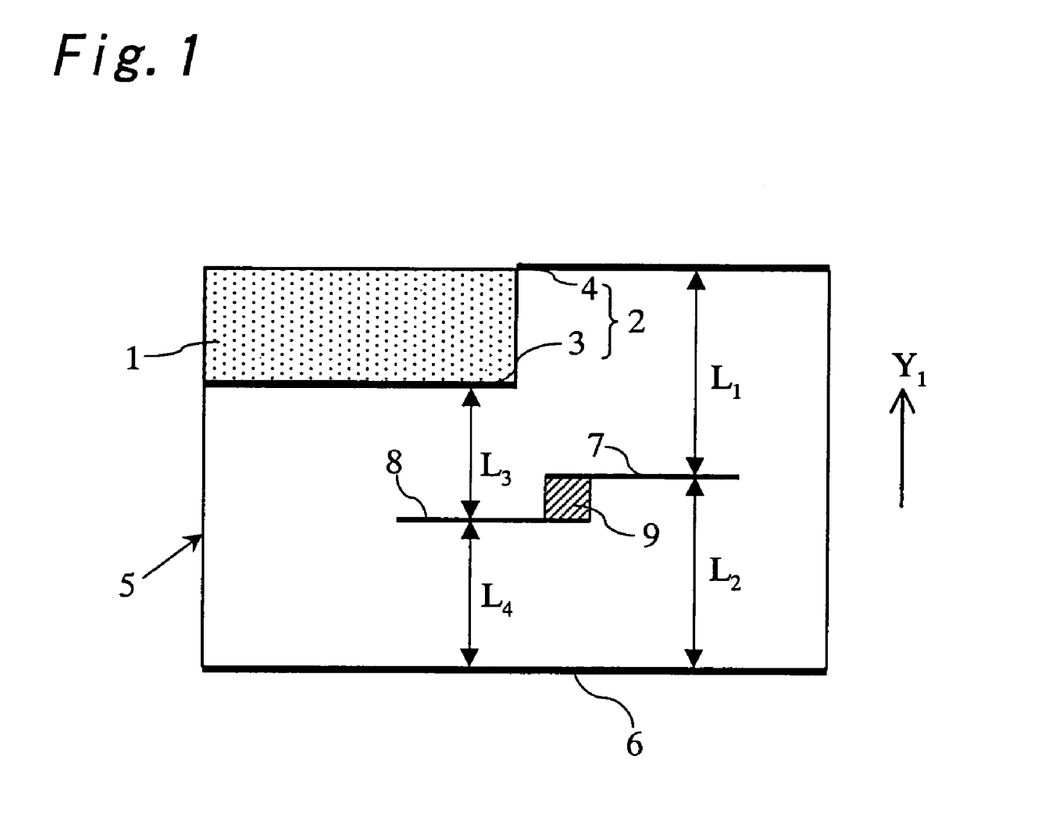
FIG. 1 is a cross-sectional view of a strip line portion according to the first embodiment.
Figure 2:
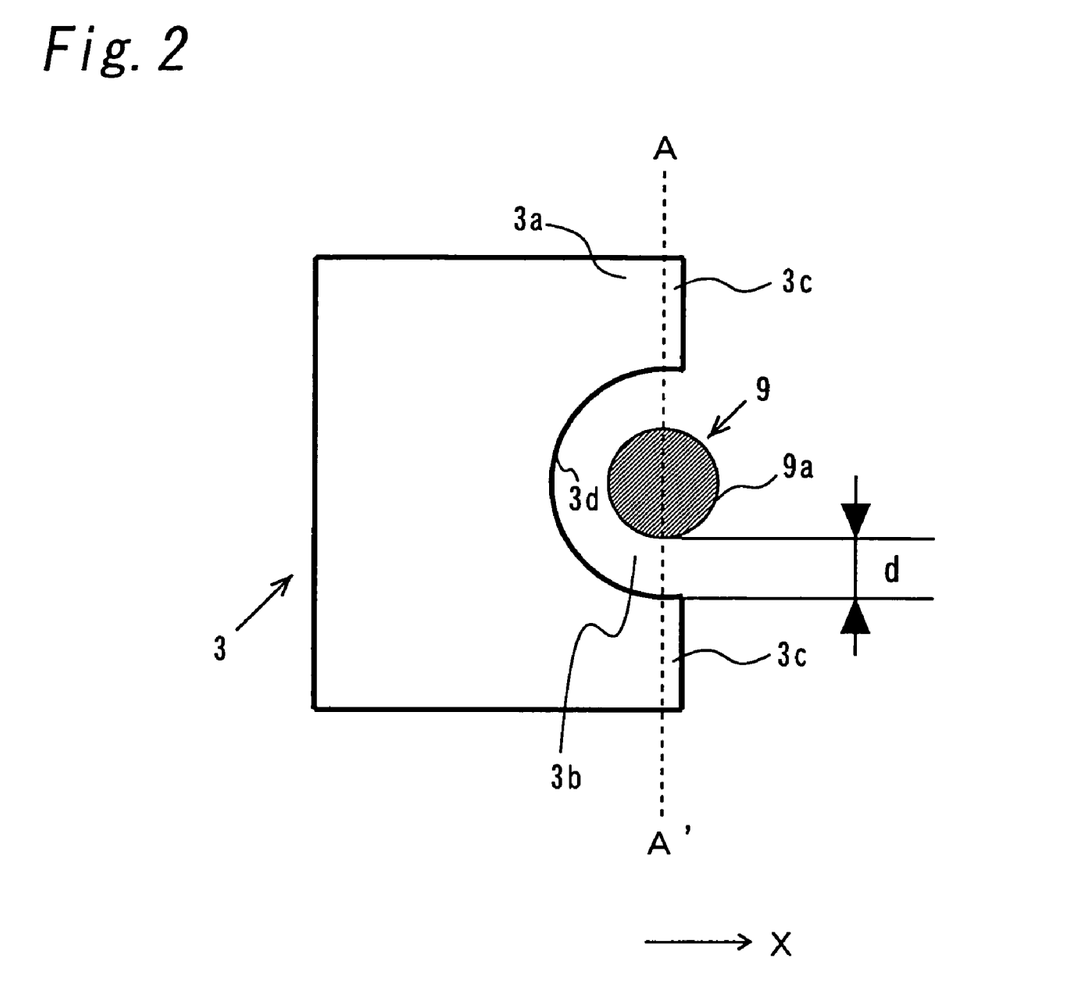
FIG. 2 is a plan view of a via according to the first embodiment.

On the other hand, there is no wiring prohibited area on the lower side in FIG. 1. A second grounding conductor (hereinafter referred to as a second GND) 6 is formed on a single dielectric layer surface, unlike the first GND 2, which includes a plurality of (two) GND portions each formed on a different dielectric layer surface.

Conventionally, an entire GND is formed on a single surface of a dielectric layer regardless of the presence or absence of a wiring prohibited area, as shown in FIG. 7C. For example, the entire first GND 2 is conventionally formed on the same surface as the first GND portion 3 (that is, the second GND portion 4 and the first GND portion 3 are formed on the same surface). Then, the strip conductor is formed such that it is disposed at or near the middle position between the first GND 2 and the second GND 6.

In contrast, the present embodiment is characterized in that the GND portion for an area other than a wiring prohibited area is formed on a different dielectric layer surface than that on which the GND portion for the wiring prohibited area is formed. Specifically, in FIG. 1, the second GND portion 4 is displaced upwardly with respect to the first GND portion 3. Changing the set position of the GND (the GND portion) in this manner changes the distance between the strip conductor and the GND (the GND portion). Therefore, the strip conductor is displaced such that it is disposed at or near the middle position between the two GNDs (the GND portions) sandwiching it. This arrangement makes it possible to increase the distances between the strip conductor and the GNDs (that is, the distance between the ground conductors) without increasing the thickness of the multilayer substrate.

Specifically, to set the distance between the strip conductor and the first GND equal to the distance between the strip conductor and the second GND, the strip conductor is divided into a first strip conductor and a second strip conductor, which are disposed such that the their positions in the Y1 direction are different from each other. In the example of FIG. 1, the second strip conductor 7 is displaced upwardly with respect to the first strip conductor 8. With this arrangement, the distance $L_1$ from the second strip conductor 7 to the second GND portion 4 can be designed to be equal to the distance $L_2$ from the second strip conductor 7 to the second GND 6. Thus, the distance between the grounding conductors (that is, the distance b in FIG. 7B) can be (partially) increased; in the above arrangement, the distance between the second GND portion 4 and the second GND 6 can be made larger than in the conventional arrangement.

The first strip conductor 8, on the other hand, is formed at the same position as the original strip conductor; that is, the first strip conductor 8 is formed such that the distance $L_3$ from the first strip conductor 8 to the first GND portion 3 is equal to the distance $L_4$ from the first strip conductor 8 to the second GND 6.

The first strip conductor 8 is electrically connected to the second strip conductor 7 by way of a via 9. This allows signals to be transmitted between the first strip conductor 8 and the second strip conductor 7 through the via 9.

According to the present embodiment, one end of the first grounding conductor (GND) portion is preferably formed such that it runs along the periphery of the via as viewed in the lamination direction of the multilayer substrate. At that time, the GNDs are arranged so as not to adversely affect the function of the entire strip line.

For example, one end 3a of the first GND portion 3 has a semicircular cutout portion 3b having a diameter equal to the diameter of the via+2d. Further, the end 3a also has protruding portions 3c which sandwich the cutout portion 3b. The via 9 is disposed such that the distance between an edge 3d of the cutout portion 3b and an edge 9a of the via 9 is equal to d. The edges of the protruding portions 3c protrude (in the x direction in the figure) outside of line A–A' which passes through the center of the via 9 and runs in parallel with the longitudinal direction of the figure. With this arrangement, the first GND portion 3 can encircle more than half the cross section of the via 9.

Further, the distance d from the first GND portion 3 to the via 9 is designed to be equal to the distances from the second GND portion 4 to the via 9 and from the second GND 6 to the via 9. If, however, the distance from the second GND portion 4 to the via 9 is not equal to that from the second GND 6 to the via 9, the distance d is set equal to the shorter one of them.

Disposing the GNDs near the via in this manner makes it possible to reduce signal leakage between the wiring prohibited area and the strip conductors through the via.

The above example of the present embodiment has a wiring prohibited area only on the upper side (of the substrate) in FIG. 1. However, the present invention is not limited to this particular arrangement. For example, a wiring prohibited area may be provided only on the lower side in FIG. 1. It should be noted that the lower side may be defined as the rear side of the multilayer substrate.

The present embodiment can increase the distances between the strip conductors and the GNDs and thereby reduce the signal loss in the strip line, making it possible to enhance the characteristics of the amplifier, such as the efficiency and gain.

The present embodiment can reduce the thickness of the multilayer substrate if the efficiency of the amplifier is set equal to that of the conventional amplifier.

The present embodiment also can reduce signal leakage between the wiring prohibited area and the strip conductors through the via by forming a GND such that it runs along the periphery of the via.

Second Embodiment

A high-frequency power amplifier of a second embodiment of the present invention will be described with reference to FIG. 3. According to the present embodiment, a wiring prohibited area is provided on both the top and rear sides of a multilayer substrate.

A strip line is disposed within the multilayer substrate formed as a result of laminating a plurality of dielectric layers. FIG. 3 is a cross-sectional view of the strip line portion of this multilayer substrate.

In the figure, a first wiring prohibited area 10 is provided on the upper side of the substrate (12), while a second wiring prohibited area 11 is provided on the lower side. For example, the upper side may be defined as the obverse side of the multilayer substrate on which the semiconductor devices are mounted, and the lower side may be defined as the reverse side of the multilayer substrate. The first wiring prohibited area 10 and the second wiring prohibited area 11 overlap each other as viewed in the $Y_2$ direction in the figure. It should be noted that the $Y_2$ direction coincides with the lamination direction of the dielectric layers (not shown) of the multilayer substrate 12. Further, the length $l_1$ of the first wiring prohibited area 10 in the $Y_2$ direction is longer than the length $l_2$ of the second wiring prohibited area 11 in the $Y_2$ direction.

According to the present embodiment, the strip line includes a first grounding conductor (hereinafter referred to as a first GND) 13 and a second grounding conductor (hereinafter referred to as a second GND) 14. The first GND 13 is made up of a first grounding conductor portion (hereinafter referred to as a first GND portion) 15 formed for the first wiring prohibited area 10 and a second grounding conductor portion (hereinafter referred to as a second GND portion) 16 formed for an area other than the first wiring prohibited area 10. The second GND 14, on the other hand, is made up of a third grounding conductor portion (hereinafter referred to as a third GND portion) 17 formed for the second wiring prohibited area 11 and a fourth grounding conductor portion (hereinafter referred to as a fourth GND portion) 18 formed for an area other than the second wiring prohibited area 11.

The present embodiment is characterized in that: the second GND portion (16) on the obverse side of the multilayer substrate provided for an area other than the first wiring prohibited area (10) is formed on a different dielectric layer surface than that on which the first GND portion (15) provided for the first wiring prohibited area (10) is formed; and the fourth GND portion (18) on the reverse side of the multilayer substrate provided for an area other than the second wiring prohibited area (11) is formed on a different dielectric layer surface than that on which the third GND portion (17) provided for the second wiring prohibited area (11) is formed. That is, each GND portion provided for an area other than the wiring prohibited areas is displaced from its conventional position. A strip conductor is provided between the first GND and the second GND. Changing the set positions of the GNDs (the second and fourth GND portions) in the above manner changes the distances between the strip conductor and the GNDs (the second and fourth GND portions). Therefore, the strip conductor is displaced such that the strip conductor is disposed at or near the middle position between the two GNDs sandwiching it. This arrangement makes it possible to increase the distances between the strip conductor and the GNDs without increasing the thickness of the multilayer substrate.

Specifically, to set the distance between the strip conductor and the first GND equal to the distance between the strip conductor and the second GND, the strip conductor is divided into a first strip conductor (20) and a second strip conductor (19) which are disposed such that their positions in the lamination direction are different from each other. In FIG. 3, since the length $l_1$ of the first wiring prohibited area 10 is longer than the length $l_2$ of the second wiring prohibited area 11, the second GND portion 16 is moved a longer distance than the fourth GND portion 18. Therefore, the second strip conductor 19 is formed such that it is displaced upwardly with respect to the first strip conductor 20 and thereby disposed at or near the middle position between the second GND portion 16 and the fourth GND portion 18. The first strip conductor 20, on the other hand, is set to remain at the original (conventional) position, that is, at or near the middle position between the first GND portion 15 and the third GND portion 17.

With this arrangement, the distance $L_5$ from the second strip conductor 19 to the second GND portion 16 can be designed to be equal to the distance $L_6$ from the second strip conductor 19 to the fourth GND portion 18. Likewise, the distance $L_7$ from the first strip conductor 20 to the first GND portion 15 can be designed to be equal to the distance $L_8$ from the first strip conductor 20 to the third GND portion 17.

The first strip conductor 20 is electrically connected to the second strip conductor 19 by way of a via 21. This allows signals to be transmitted between the first strip conductor 20 and the second strip conductor 19 through the via 21.

According to the present embodiment, GNDs are preferably formed around the periphery of the via, as in the first embodiment. That is, in FIG. 3, the first GND portion 15 and the third GND portion 17 are disposed near the via 21.

Specifically, as in FIG. 2 described in connection with the first embodiment, the distance from the first GND portion 15 to the via 21 (corresponding to the distance d in FIG. 2) is designed to be equal to the distances from the second GND portion 16 to the via 21 and from the fourth GND portion 18 to the via 21. If, however, the distance from the second GND portion 16 to the via 21 is not equal to that from the fourth GND portion 18 to the via 21, the distance from the first GND portion 15 to the via 21 is set equal to the shorter one of them.

The same goes for the third GND portion 17. The distance from the third GND portion 17 to the via 21 (corresponding to the distance d in FIG. 2) is designed to be equal to the distances from the second GND portion 16 to the via 21 and from the fourth GND portion 18 to the via 21. If, however, the distance from the second GND portion 16 to the via 21 is not equal to that from the fourth GND portion 18 to the via 21, the distance from the third GND portion 17 to the via 21 is set equal to the shorter one of them.

Disposing the GNDs near the via in this manner makes it possible to reduce signal leakage between the wiring prohibited areas and the strip conductors through the via.

Figure 3:
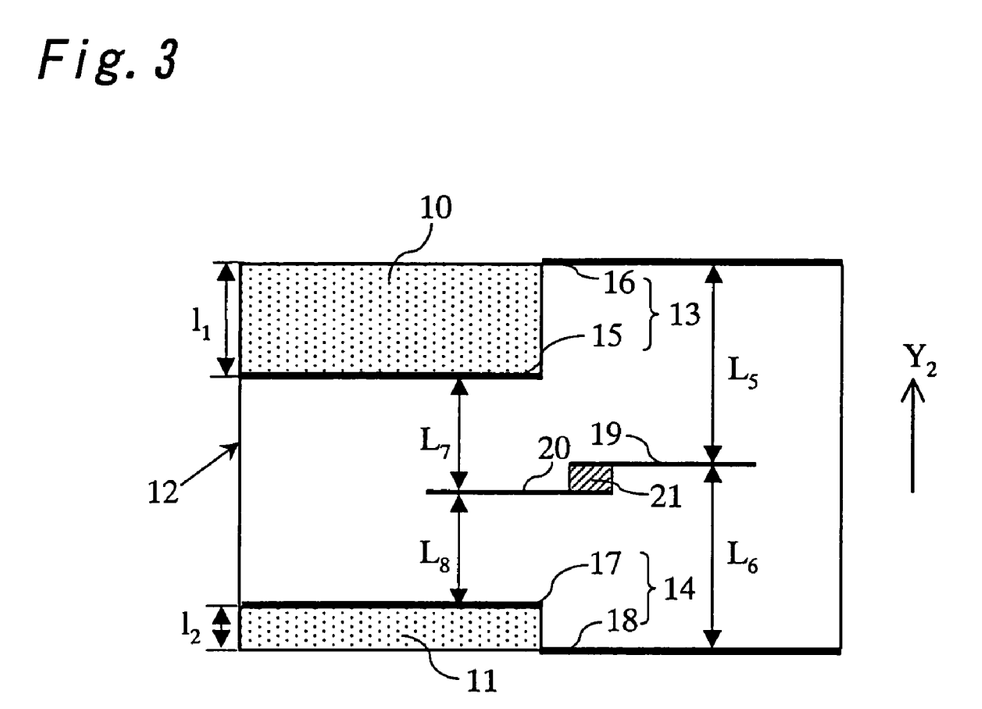
FIG. 3 is a cross-sectional view of a strip line portion according to the second embodiment.

According to the present embodiment, the length $l_2$ of the second wiring prohibited area 11 is shorter than the length $l_1$ of the first wiring prohibited area 10, as shown in FIG. 3. However, the present invention is not limited to this particular arrangement. The length $l_1$ of the first wiring prohibited area 10 may be shorter than the length $l_2$ of the second wiring prohibited area 11.

That is, the present invention (the present embodiment) can be applied to the case where: the length of the wiring prohibited area provided on the obverse side of the multilayer substrate is different from that of the wiring prohibited area provided on the reverse side (it should be noted that the length of a wiring prohibited area is measured in the lamination direction of the substrate); and the strip conductor must be divided into two strip conductors whose positions in the lamination direction are different from each other so that they can be disposed at or near the middle position between the obverse side GND and the reverse side GND.

The present embodiment can increase the distances between the strip conductor and the GNDs and thereby reduce the signal loss in the strip line, making it possible to enhance the characteristics of the amplifier, such as the efficiency and gain.

The present embodiment can reduce the thickness of the multilayer substrate if the efficiency of the amplifier is set equal to that of the conventional amplifier.

The present embodiment also can reduce signal leakage between the wiring prohibited areas and the strip conductors through the via by forming GNDs such that they run along the periphery of the via.

Third Embodiment

A high-frequency power amplifier of a third embodiment of the present invention will be described with reference to FIG. 4. According to the present embodiment, a wiring prohibited area is provided on both the obverse and reverse sides of a multilayer substrate, and these wiring prohibited areas do not overlap each other as viewed in the lamination of the multilayer substrate.

A strip line is disposed within the multilayer substrate formed as a result of laminating a plurality of dielectric layers. FIG. 4 is a cross-sectional view of the strip line portion of this multilayer substrate.

In the figure, a first wiring prohibited area 25 is provided on the upper side of the substrate (27), while a second wiring prohibited area 26 is provided on the lower side. The first wiring prohibited area 25 and the second wiring prohibited area 26 are disposed such that they do not overlap each other as viewed in the $Y_3$ direction in the figure. It should be noted that the $Y_3$ direction coincides with the lamination direction of the dielectric layers (not shown) of the multilayer substrate 27.

According to the present embodiment, the length $l_3$ of the first wiring prohibited area 25 in the $Y_3$ direction may be different from the length $l_4$ of the second wiring prohibited area 26 in the $Y_3$ direction, or they may be equal to each other. FIG. 4 shows an example in which these lengths are equal to each other.

Further, for example, the upper side may be defined as the obverse side of the multilayer substrate on which the semiconductor devices are mounted, and the lower side may be defined as the reverse side of the multilayer substrate.

According to the present embodiment, the strip line includes a first grounding conductor (hereinafter referred to as a first GND) 28 and a second grounding conductor (hereinafter referred to as a second GND) 29. The first GND 28 is made up of a first grounding conductor portion (hereinafter referred to as a first GND portion) 30 formed for the first wiring prohibited area 25 and a second grounding conductor portion (hereinafter referred to as a second GND portion) 31 formed for an area other than the first wiring prohibited area 25. The second GND 29, on the other hand, is made up of a third grounding conductor portion (hereinafter referred to as a third GND portion) 32 formed for the second wiring prohibited area 26 and a fourth grounding conductor portion (hereinafter referred to as a fourth GND portion) 33 formed for an area other than the second wiring prohibited area 26.

Conventionally, each entire GND is formed on a single surface of a dielectric layer regardless of the presence or absence of a wiring prohibited area, as shown in FIG. 7C. For example, in FIG. 4, the entire first GND 28 is conventionally formed on the same surface as the first GND portion 30 (that is, the first GND portion 30 and the second GND portion 31 are formed on the same surface). Likewise, the entire second GND 29 is formed on the same surface as the fourth GND portion 33 (that is, the third GND portion 32 and the fourth GND portion 33 are formed on the same surface). Then, the strip conductor is formed on a single dielectric layer surface such that it is disposed at or near the middle position between the first GND 28 and the second GND 29.

In contrast, the present embodiment is characterized in that each GND portion provided for an area other than a wiring prohibited area is formed on a different dielectric layer surface than that on which the GND portion provided for the wiring prohibited area is formed. That is, the second GND portion 31 and the first GND portion 30 are formed on different dielectric layer surfaces. Likewise, the third GND portion 32 and the fourth GND portion 33 are also formed on different dielectric layer surfaces.

On the other hand, adoption of the above configuration changes the distance from the strip conductor to each GND. Therefore, according to the present embodiment, the strip conductor is divided into two portions, which are displaced from their original positions such that they are disposed at or near the middle position between the two GNDs (the GND portions). This arrangement makes it possible to increase the distances between the strip conductor and the GNDs without increasing the thickness of the multilayer substrate.

Specifically, the strip line of the present embodiment includes a first strip conductor (35) and a second strip conductor (34). In the example of FIG. 4, since the length $l_3$ of the first wiring prohibited area 25 is equal to the length $l_4$ of the second wiring prohibited area 26, the second GND portion 31 is moved upwardly and the third GND portion 32 is moved downwardly a same distance. Accordingly, the first strip conductor 35 is moved downwardly and the second strip conductor 34 is moved upwardly a same distance. With this arrangement, in FIG. 4, the distance $L_9$ from the second strip conductor 34 to the second GND portion 31 can be designed to be equal to the distance $L_{10}$ from the second strip conductor 34 to the fourth GND portion 33. Likewise, the distance $L_{11}$ from the first strip conductor 35 to the first GND portion 30 can be designed to be equal to the distance $L_{12}$ from the first strip conductor 35 to the third GND portion 32. Adoption of this configuration can increase the distance between the grounding conductors (the distance b in FIG. 7B), as compared with the conventional configuration.

As described above, the present embodiment can also be applied when the length $l_3$ of the first wiring prohibited area 25 is different from the length $l_4$ of the second wiring prohibited area 26.

Figure 4:
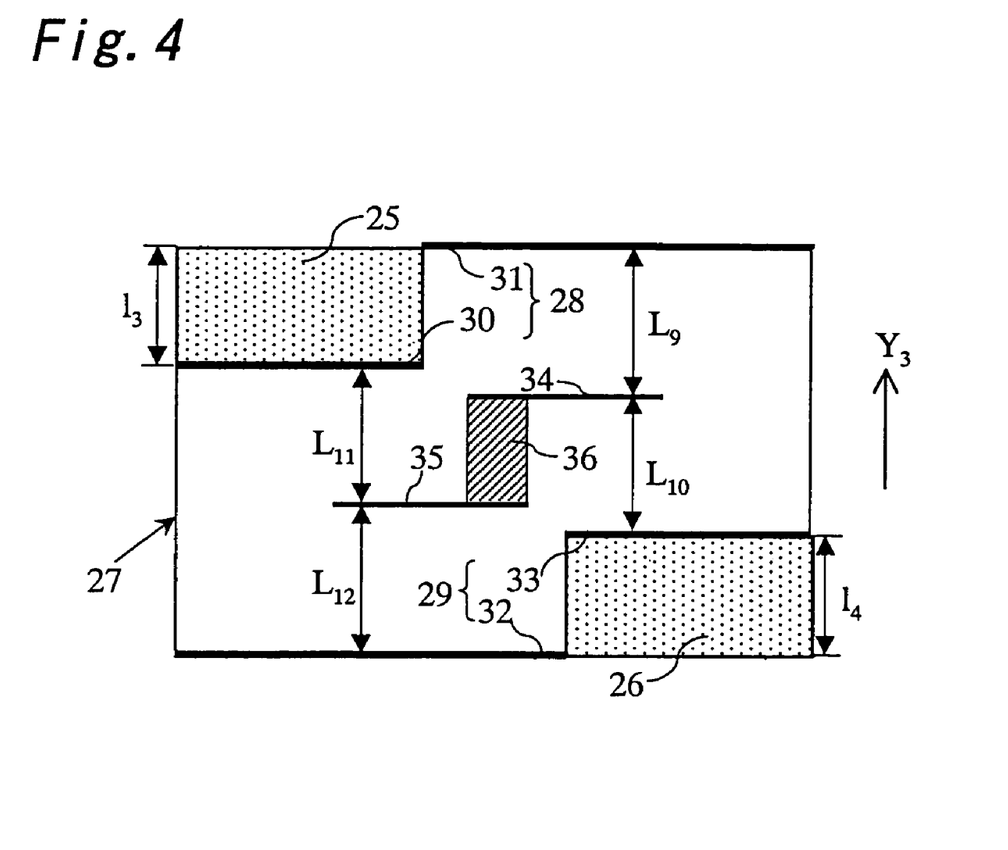
FIG. 4 is a cross-sectional view of a strip line portion according to the third embodiment.

In FIG. 4, assume, for example, that the length $l_3$ is shorter than the length $l_4$. In this case, to set the distance $L_{11}$ between the first strip conductor 35 and the first GND portion 30 equal to the distance $L_{12}$ between the first strip conductor 35 and the third GND portion 32, the position of the first strip conductor 35 in the $Y_3$ direction is set higher than that in FIG. 3. If, on the other hand, the length $l_4$ is shorter than the length $l_3$, the position of the second strip conductor 34 in the $Y_3$ direction is set lower than that in FIG. 3. In either case, however, it is arranged that the first strip conductor 35 and the second strip conductor 34 are disposed between the first GND portion 30 and the fourth GND portion 33.

The first strip conductor 35 is electrically connected to the second strip conductor 34 by way of a via 36. This allows signals to be transmitted between the first strip conductor 35 and the second strip conductor 34 through the via 36.

According to the present embodiment, GNDs (GND portions) are preferably disposed around the periphery of the via, as in the first embodiment. That is, in FIG. 4, the first GND portion 30 and the fourth GND portion 33 are disposed near the via 36.

Specifically, as in FIG. 2 described in connection with the first embodiment, the distance from the first GND portion 30 to the via 36 (corresponding to the distance d in FIG. 2) is designed to be equal to the distances from the second GND portion 31 to the via 36 and from the fourth GND portion 33 to the via 36. If, however, the distance from the second GND portion 31 to the via 36 is not equal to the distance from the fourth GND portion 33 to the via 36, the distance from the first GND portion 30 to the via 36 is set equal to the shorter one of them.

The same goes for the fourth GND portion 33. The distance from the fourth GND portion 33 to the via 36 (corresponding to the distance d in FIG. 2) is designed to be equal to the distances from the first GND portion 30 to the via 36 and from the third GND portion 32 to the via 36. If, however, the distance from the first GND portion 30 to the via 36 is not equal to that from the third GND portion 32 to the via 36, the distance from the fourth GND portion 33 to the via 36 is set equal to the shorter one of them.

Disposing the GNDs near the via in this manner makes it possible to reduce signal leakage between the strip conductors and the wiring prohibited areas through the via.

The present embodiment can increase the distance between the strip conductor and the GNDs and thereby reduce the signal loss in the strip line, making it possible to enhance the characteristics of the amplifier, such as the efficiency and gain.

The present embodiment can reduce the thickness of the multilayer substrate if the efficiency of the amplifier is set equal to that of the conventional amplifier.

The present embodiment also can reduce signal leakage between the wiring prohibited areas and the strip conductors through the via by forming GNDs such that they run along the periphery of the via.

Fourth Embodiment

A high-frequency power amplifier of a fourth embodiment of the present invention will be described with reference to FIG. 5. According to the present embodiment, a wiring prohibited area is provided on both the obverse and reverse sides of a multilayer substrate. These wiring prohibited areas have the same length in the lamination direction and are disposed such that they overlap each other as viewed in the lamination direction of the multilayer substrate.

A strip line is disposed within the multilayer substrate formed as a result of laminating a plurality of dielectric layers. FIG. 5 is a cross-sectional view of the strip line portion of this multilayer substrate.

In the figure, a first wiring prohibited area 40 is provided on the upper side of the substrate (12), while a second wiring prohibited area 41 is provided on the lower side. The first wiring prohibited area 40 and the second wiring prohibited area 41 overlap each other as viewed in the $Y_4$ direction. It should be noted that the $Y_4$ direction coincides with the lamination direction of the dielectric layers (not shown) of the multilayer substrate 12.

The present embodiment is characterized in that the $l_5$ of the first wiring prohibited area 40 in the $Y_4$ direction is equal to the length $l_6$ of the second wiring prohibited area 41 in the $Y_4$ direction.

Further, for example, the upper side may be defined as the obverse side of the multilayer substrate on which the semiconductor devices are mounted, and the lower side may be defined as the reverse side of the multilayer substrate.

According to the present embodiment, the strip line includes a first grounding conductor (hereinafter referred to as a first GND) 43 and a second grounding conductor (hereinafter referred to as a second GND) 44. The first GND 43 is made up of a first grounding conductor portion (hereinafter referred to as a first GND portion) 45 formed for the first wiring prohibited area 40 and a second grounding conductor portion (hereinafter referred to as a second GND portion) 46 formed for an area other than the first wiring prohibited area 40. The second GND 44, on the other hand, is made up of a third grounding conductor portion (hereinafter referred to as a third GND portion) 47 formed for the second wiring prohibited area 41 and a fourth grounding conductor portion (hereinafter referred to as a fourth GND portion) 48 formed for an area other than the second wiring prohibited area 41.

Conventionally, each entire GND is formed on a single surface of a dielectric layer regardless of the presence or absence of a wiring prohibited area, as shown in FIG. 7C. For example, referring to FIG. 5, the entire first GND 43 is conventionally formed on the same surface as the first GND portion 45 (that is, the first GND portion 45 and the second GND portion 46 are formed on the same surface). Likewise, the entire second GND 44 is conventionally formed on the same surface as the third GND portion 47 (that is, the third GND portion 47 and the fourth GND portion 48 are formed on the same surface). Then, the strip conductor is formed on a single dielectric layer surface such that it is disposed at or near the middle position between the first GND 43 and the second GND 44.

In contrast, the present embodiment is characterized in that each GND portion provided for an area other than a wiring prohibited area is formed on a different dielectric layer surface than that on which the GND portion provided for the wiring prohibited area is formed. That is, the second GND portion 46 and the first GND portion 45 are formed on different dielectric layer surfaces. Likewise, the fourth GND portion 48 and the third GND portion 47 are formed on different dielectric layer surfaces. A detailed description of this configuration is as follows.

Figure 5:
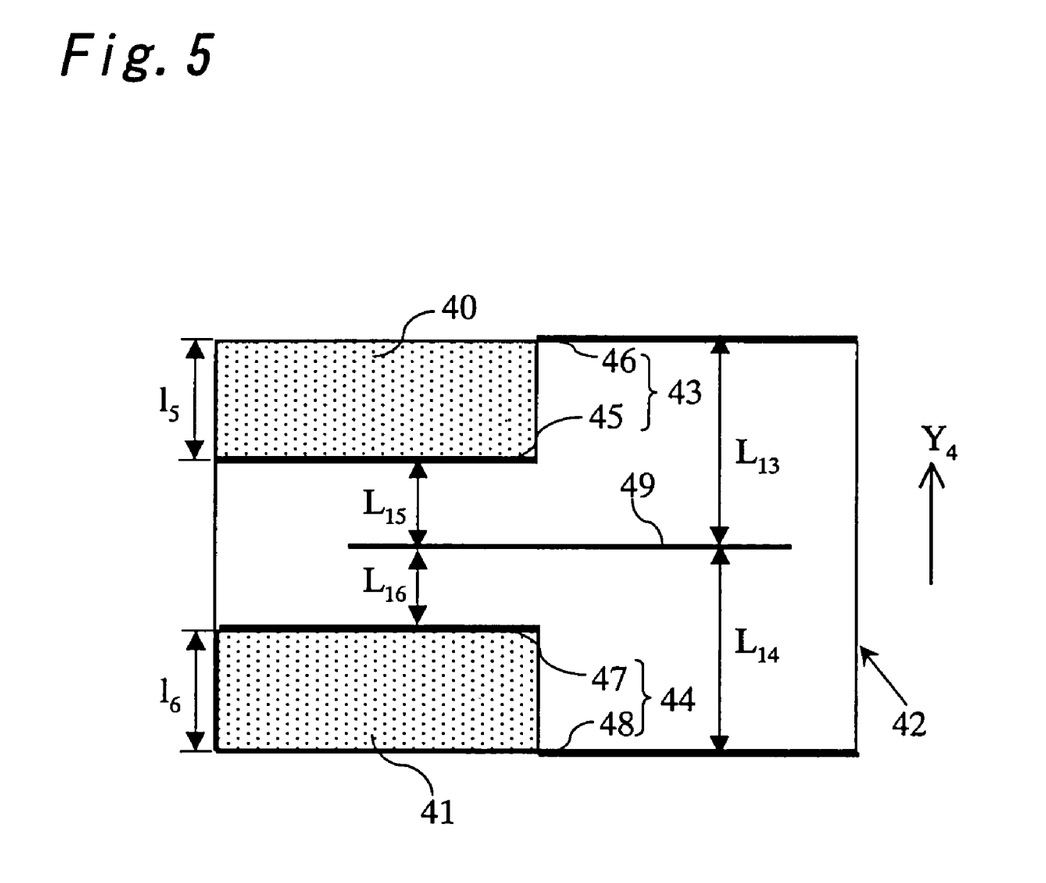
FIG. 5 is a cross-sectional view of a strip line portion according to the forth embodiment.

In the example of FIG. 5, the first wiring prohibited area 40 and the second wiring prohibited area 41 overlap each other as viewed in the lamination direction (the $Y_4$ direction), and the length $l_5$ of the first wiring prohibited area 40 is equal to the $l_6$ of the second wiring prohibited area 41. Therefore, according to the present embodiment, the second GND portion 46 is moved upwardly with respect to the first GND portion 45, and the fourth GND portion 48 is moved downwardly with respect to the third GND portion 47 a same distance. In this case, it is not necessary to move a strip conductor 49, since it is automatically set at or near the middle position between the first GND portion 45 and the third GND portion 47 and between the second GND portion 46 and the fourth GND portion 48. That is, according to the present embodiment, the strip conductor is formed on only a single dielectric layer surface, unlike the first to third embodiments. Specifically, the strip conductor need not be divided into two or more portions so that they can be disposed on two or more dielectric layer surfaces. Therefore, there is no need for a via for connecting these strip conductor portions.

With this arrangement, the distance $L_{13}$ from the strip conductor 49 to the second GND portion 46 can be designed to be equal to the distance $L_{14}$ from the strip conductor 49 to the fourth GND portion 48. Likewise, the distance $L_{15}$ from the strip conductor 49 to the first GND portion 45 can be designed to be equal to the distance $L_{16}$ from the strip conductor 49 to the third GND portion 47. Furthermore, it is possible to increase the distance between the grounding conductors (that is, the distance b in FIG. 7B), specifically, the distance between the second GND portion 46 and the fourth GND portion 48, as compared with the conventional arrangement.

The present embodiment can increase the distances between the strip conductor and the GNDs and thereby reduce the signal loss in the strip line, making it possible to enhance the characteristics of the amplifier, such as the efficiency and gain.

The present embodiment can reduce the thickness of the multilayer substrate if the efficiency of the amplifier is set equal to that of the conventional amplifier.

As used in the above description of the present invention, the term "wiring prohibited area" does not mean an area in which all types of wiring are prohibited. It means an area in which wiring for a strip line of the present invention is prohibited. Therefore, for example, wiring for other strip lines (unrelated to the present invention) and a via for interconnecting them may be formed in the wiring prohibited area.

The above descriptions of the second to fourth embodiments use such expressions as "the length of the first wiring prohibited area in the lamination direction is equal to the length of the second wiring prohibited area in the lamination direction" and "the length of the first wiring prohibited area in the lamination direction is different from the length of the, second wiring prohibited area in the lamination direction". It should be noted that these expressions do not imply any strict comparison of lengths. Even if the strip conductor has been designed to be provided at or near the middle position between the grounding conductors, it may be actually formed such that it is displaced from that designed position due to the thicknesses of the insulation films formed between the grounding conductors. Therefore, even when the lengths of the wiring prohibited areas are not exactly equal to each other, if an amplifier having satisfactory characteristics can be manufactured by use of a single strip conductor, the arrangement devised when the length of the first wiring prohibited area in the lamination direction is equal to the length of the second wiring prohibited area in the lamination direction may be applied. If, on the other hand, it is desirable to divide the strip conductor into two pieces (employ two strip conductors), the arrangement devised when "the length of the first wiring prohibited area in the lamination direction is different from the length of the second wiring prohibited area in the lamination direction" may be applied.

Further, according to the first to fourth embodiments, the strip conductor is disposed at or near the middle position between the two grounding conductors. However, the present invention is not limited to this particular arrangement. Even though it is preferable to employ the above configuration in terms of improving the device characteristics, the strip conductor may be designed to be formed such that it is displaced from the middle position, taking into consideration the connection of the strip conductor with other strip lines located over and under it in the lamination direction. The present invention can also be applied to such a case. The present invention can increase the distance between the grounding conductors. Therefore, even when the strip conductor is formed such that it is displaced from the middle position between the grounding conductors, it is possible to reduce the resistance and hence reduce the signal loss in the strip line.

High-frequency power amplifiers of the present invention can be combined with couplers, switches, filters, isolators, etc. to form composite modules.

The features and advantages of the present invention may be summarized as follows.

According to one aspect, the present invention can increase the distance between the grounding conductors without changing the thickness of the substrate, making it possible to reduce the resistance and the signal loss in the strip line and thereby provide a small high-frequency power amplifier having high efficiency.

According to another aspect, the present invention also can reduce signal leakage between the wiring prohibited area and the strip conductors through the via by forming one end of a grounding conductor such that it runs along the periphery of the via.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-056298, filed on Mar. 3, 2003 including specification, claims, drawings and summary, on which the Convention priority of the present application is based, are incorporated herein by reference in its entirety.

What is claimed is:

1. A power amplifier comprising:
    a multilayer substrate including a plurality of laminated dielectric layers;
    a wiring prohibited area located on at least one of an obverse side and a reverse side of said multilayer substrate in which wiring is prohibited;
    a first strip conductor located within said multilayer substrate;
    a second strip conductor located within said multilayer substrate at a position, in a lamination direction of said multilayer substrate, different from that of said first strip conductor;
    a via electrically connecting said first strip conductor to said second strip conductor; and
    a first grounding conductor and a second grounding conductor disposed sequentially in the lamination direction of said multilayer substrate and sandwiching said first strip conductor and said second strip conductor, wherein said first grounding conductor includes:
       a first grounding conductor portion located in said wiring prohibited area; and
       a second grounding conductor portion located in an area other than said wiring prohibited area so that said second grounding conductor portion is positioned, with respect to the lamination direction of said multilayer substrate, at a position different from said first grounding conductor portion.

2. The power amplifier according to claim 1, wherein said wiring prohibited area includes:
    a first wiring prohibited area located on the obverse side of said multilayer substrate; and
    a second wiring prohibited area located on the reverse side of said multilayer substrate, said second wiring prohibited area overlapping said first wiring prohibited area, when viewed in the lamination direction of said multilayer substrate, wherein length of said first wiring prohibited area in said lamination direction of said multilayer substrate is different from that of said second wiring prohibited area.

3. The power amplifier according to claim 1, wherein said wiring prohibited area includes:
    a first wiring prohibited area located on the obverse side of said multilayer substrate; and
    a second wiring prohibited area located on the reverse side of said multilayer substrate, said second wiring prohibited area not overlapping said first wiring prohibited area, when viewed in the lamination direction of said multilayer substrate.

4. The power amplifier according to claim 1, wherein one end of said first grounding conductor portion runs along a periphery of said via, when viewed in the lamination direction of said multilayer substrate.

5. The power amplifier according to claim 1, wherein said second grounding conductor includes:
    a third grounding conductor portion located in said wiring prohibited area; and
    a fourth grounding conductor portion located in an area other than said wiring prohibited area so that said fourth grounding conductor portion is positioned, with respect to the lamination direction of said multilayer substrate, at a position different from said third grounding conductor portion.

6. A power amplifier comprising:
    a multilayer substrate including a plurality of laminated dielectric layers;
    a first wiring prohibited area located on an obverse side of said multilayer substrate;
    a second wiring prohibited area located on a reverse side of said multilayer substrate, said second wiring prohibited area overlapping said first wiring prohibited area, when viewed in a lamination direction of said multilayer substrate;
    a strip conductor disposed within said multilayer substrate; and
    a first grounding conductor and a second grounding conductor disposed sequentially in the lamination direction of said multilayer substrate and sandwiching said strip conductor, wherein length of said first wiring prohibited area in the lamination direction of said multilayer substrate is equal to that of said second wiring prohibited area, and said first grounding conductor includes:
- a first grounding conductor portion for said first wiring prohibited area and
- a second grounding conductor portion for an area on the obverse side of said multilayer substrate such that said second grounding conductor portion is positioned, in the lamination direction of said multilayer substrate, different from said first grounding conductor portion, the area being outside said first wiring prohibited area; and said second grounding conductor includes:
- a third grounding conductor portion for said second wiring prohibited area; and
- a fourth grounding conductor portion for an area on the reverse side of said multilayer substrate such that said fourth grounding conductor portion is positioned, in the lamination direction of said multilayer substrate, different from said third grounding conductor portion, the area being outside said second wiring prohibited area.

* * * * *